(12) United States Patent
Chen

(10) Patent No.: US 9,918,404 B1
(45) Date of Patent: Mar. 13, 2018

(54) SERVER SLIDING RAIL MOUNTING BRACKET ASSEMBLY

(71) Applicant: GSLIDE CORPORATION, New Taipei (TW)

(72) Inventor: Yung-Liang Chen, Taipei Shien (TW)

(73) Assignee: GSLIDE CORPORATION, New Taipei (TW)

( * ) Notice: Subject to any disclaimer, the term of this patent is extended or adjusted under 35 U.S.C. 154(b) by 0 days.

(21) Appl. No.: 15/652,419

(22) Filed: Jul. 18, 2017

(30) Foreign Application Priority Data

Aug. 16, 2016 (TW) .............................. 105126096 A

(51) Int. Cl.
*H05K 7/14* (2006.01)
*A47B 88/43* (2017.01)

(52) U.S. Cl.
CPC ........... *H05K 7/1489* (2013.01); *A47B 88/43* (2017.01)

(58) Field of Classification Search
CPC .............................. H05K 7/1489; A47B 88/43
See application file for complete search history.

(56) References Cited

U.S. PATENT DOCUMENTS

| | | | |
|---|---|---|---|
| 9,377,049 B2 | 6/2016 | Hwang | |
| 9,854,911 B1 * | 1/2018 | Chang | A47B 96/068 |
| 2003/0111436 A1 * | 6/2003 | Basinger | H05K 7/1489 211/183 |
| 2009/0261699 A1 * | 10/2009 | Yu | A47B 88/43 312/334.46 |
| 2011/0135224 A1 * | 6/2011 | Chen | F16C 29/04 384/26 |
| 2011/0192946 A1 * | 8/2011 | Yu | H05K 7/1489 248/222.11 |

FOREIGN PATENT DOCUMENTS

| | | |
|---|---|---|
| TW | M427756 U | 4/2012 |
| TW | I489931 B | 6/2015 |
| TW | M509508 | 9/2015 |
| TW | I517807 | 1/2016 |
| TW | M516294 | 1/2016 |

* cited by examiner

*Primary Examiner* — Anita M King
(74) *Attorney, Agent, or Firm* — Cook Alex Ltd.

(57) ABSTRACT

A server sliding rail mounting bracket assembly includes a bracket, a top cover, an elastic member and a swing seat. When mounting, a lever of the swing seat is pushed to move hanging rods of the bracket into respective rectangular or circular mounting holes of the server rack, and the elastic member pushes second guide rods of the swing seat to move forward along respective longitudinal sliding slots of the top cover to further force a top block of the lever into abutment against an inner wall surface of the server rack and to force first guide rods of the swing seat into engagement with first or second engagement portions of the top cover. When dismounting, the lever is pushed inward to disengage the server sliding rail mounting bracket assembly and the server sliding rail assembly from the server rack. Thus, mounting and dismounting can be achieved easily without tools.

6 Claims, 14 Drawing Sheets

SERVER SLIDING RAIL MOUNTING BRACKET ASSEMBLY

BACKGROUND OF THE INVENTION

Field of the Invention

The present invention relates to server sliding rail technology and more particularly, to a server sliding rail mounting bracket assembly used in a server, which facilitates mounting and dismounting without tools, and is connectable to a server rack with rectangular mounting holes as well as a server rack with circular mounting holes.

Description of the Related Art

With common prior art apparatus, when mounting a server sliding rail assembly to a server rack, a user needs to fasten a server sliding rail mounting bracket assembly to the front end of the outer sliding rail of the server sliding rail assembly so that the server sliding rail assembly can be fastened with the server sliding rail mounting bracket assembly to the circular mounting holes or rectangular mounting holes of the server rack. Taiwan Patent Numbers M427756, I489931, M509508, M516294 and I517807 disclose similar server sliding rail mounting bracket assembly designs. Further, as illustrated in FIG. 14, after connection of a conventional prior art server sliding rail mounting bracket assembly 91 to the front end of the outer sliding rail 921 of a server sliding rail assembly 92, the conventional server sliding rail mounting bracket assembly 91 occupies a certain space around the front end of the outer sliding rail 921. Thus, the length of the intermediate sliding rail 922 is relatively shortened. Consequently, a large gap D1 is left between the front end of the intermediate sliding rail 922 and the inner wall surface 931 of the server rack 93, causing the load capacity of the server sliding rail assembly 92 to be relatively reduced.

SUMMARY OF THE INVENTION

The present invention overcomes disadvantages of the prior art. It is therefore a main object of the present invention to provide a server sliding rail mounting bracket assembly used in a server, which facilitates mounting and dismounting without tools, and is connectable to a server rack with rectangular mounting holes as well as a server rack with circular mounting holes.

To achieve this and other objects of the present invention, the server sliding rail mounting bracket assembly for connection to a server rack includes a bracket, a top cover, an elastic member and a swing seat. When mounting, a lever of the swing seat is pushed to move hanging rods of the bracket into respective rectangular or circular mounting holes of the server rack, and the elastic member immediately pushes second guide rods of the swing seat to move forward along respective longitudinal sliding slots of the top cover to further force a top block of the lever into abutment against an inner wall surface of the server rack and to force first guide rods of the swing seat into engagement with first or second engagement portions of the top cover. When dismounting, the lever is pushed inward to disengage the server sliding rail mounting bracket assembly and the server sliding rail assembly from the server rack.

Thus, mounting and dismounting of the server sliding rail mounting bracket assembly can be achieved easily without tools. Further, the hanging rods of the bracket can be engaged into rectangular mounting holes as well as circular mounting holes, and thus, the server sliding rail mounting bracket assembly is applicable to a server rack with rectangular mounting holes as well as a server with circular mounting holes. Also, after installation of the server sliding rail mounting bracket assembly with the server sliding rail assembly in the server rack, the gap between the front end of the intermediate sliding rail of the server sliding rail assembly and the inner wall surface of the server rack is minimized, and thus, the load capacity of the server sliding rail assembly can be significantly enhanced.

In a first aspect, the disclosure provides a server sliding rail mounting bracket assembly for connection to a server rack, which includes a bracket, a top cover, an elastic member and a swing seat. Said bracket comprises a base panel, an end panel extended from a front end of said base panel, a plurality of hanging rods located on an inner surface of said end panel and vertically spaced in line, said bracket being fixedly connected to a front end of an outer sliding rail of a server sliding rail assembly and to the top cover, each said hanging rod comprising a first positioning rod portion connected to said end panel and a second positioning rod portion axially extended from said first positioning rod portion, the width of said first positioning rod portions of said hanging rods being larger than the width of said second positioning rod portions but smaller than the width of rectangular mounting holes of a server rack, the width of said second positioning rod portions being smaller than the diameter of circular mounting holes of the said server rack. Said top cover comprises a cover base panel, top and bottom panels respectively and perpendicularly extended from opposing top and bottom sides of said cover base panel, top and bottom end flanges respectively and outwardly extended from respective distal ends of said top and bottom panels remote from said cover base panel and being connected to said bracket, two longitudinal sliding slots respectively located on said top and bottom panels, two first engagement portions respectively located at respective front ends of said longitudinal sliding slots, two second engagement portions respectively located between said first engagement portions and said longitudinal sliding slots and an elastic member retainer located at said cover base panel. Said elastic member has one end thereof connected to said elastic member retainer of said cover base panel and an opposite end thereof connected to a swing seat. Said swing seat comprises a seat base, top and bottom seat plates respectively located at opposing top and bottom sides of said seat base, first guide rods and second guide rods respectively located at said top and bottom seat plates near two opposite ends and respectively slidably inserted into said longitudinal sliding slots in said top and bottom panels of said top cover to guide movement of said swing seat along said longitudinal sliding slots and allowing said first guide rods to be detachably and selectively forced into engagement with said first engagement portions or said second engagement portions, an elastic member retainer extended from a rear side of said seat base for securing the said opposite end of said elastic member and a lever extended from an opposing front side of said seat base and terminating in a stop block for abutment against an inner wall surface of a server rack.

DETAILED DESCRIPTION OF THE INVENTION

Figure 1:
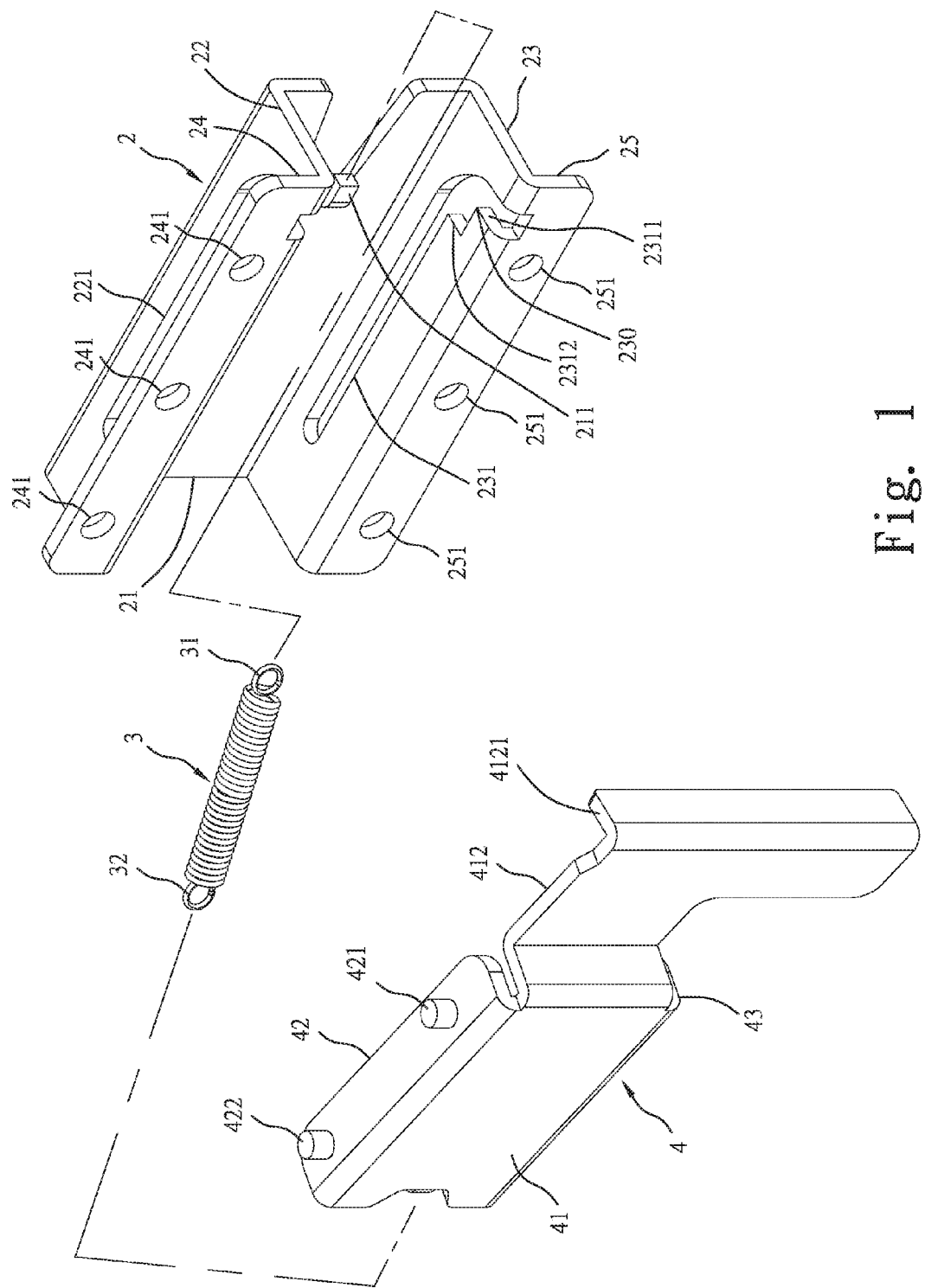
FIG. 1 is an exploded perspective view of a top cover, an elastic member and a swing seat of a server sliding rail mounting bracket assembly in accordance with the present invention.
Figure 2:
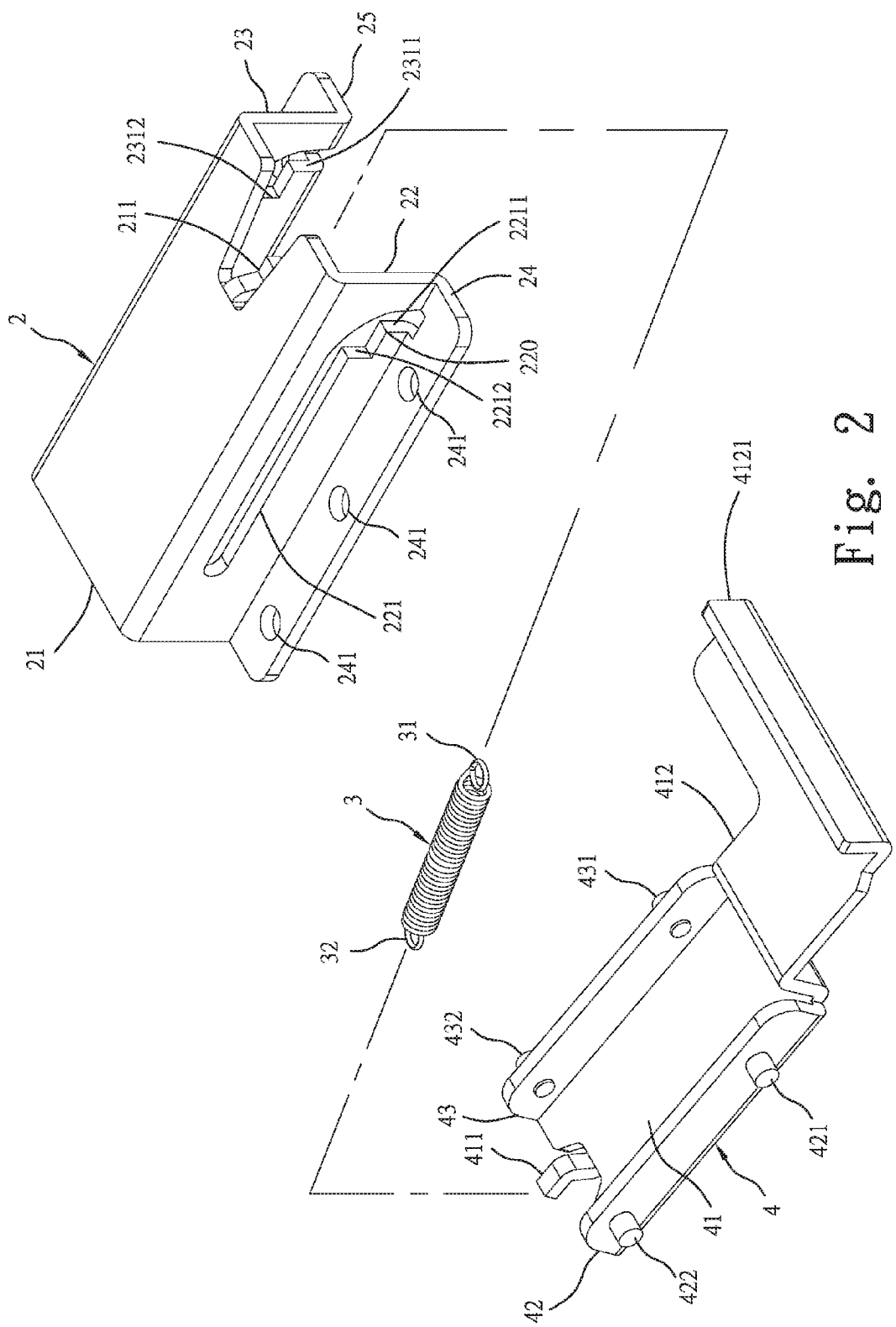
FIG. 2 is an exploded perspective view that corresponds to FIG. 1, when viewed from another angle.

Referring to FIGS. 1-13, a server sliding rail mounting bracket assembly 10 in accordance with the present invention is shown. The server sliding rail mounting bracket assembly 10 includes a bracket 1, a top cover 2, an elastic member 3, and a swing seat 4.

The bracket 1 (see FIG. 3) includes a base panel 11, an end panel 12 extended from a front end of the base panel 11, and a plurality of hanging rods 13 located on an inner surface 121 of the end panel 12 and vertically spaced in line (see FIGS. 3-5 and FIG. 7). Each hanging rod 13 includes a first positioning rod portion 131 connected to the end panel 12 and a second positioning rod portion 132 axially extended from the first positioning rod portion 131. The bracket 1 is fixedly connected to a front end of an outer sliding rail 51 of a server sliding rail assembly 5 and to the top cover 2. Examples of such connections are shown, for instance wherein the bracket 1 includes a plurality of first through holes 111 disposed near a bottom portion of the base panel 11 by which the bracket 1 is fixedly fastened to a front end of an outer sliding rail 51 of a server sliding rail assembly 5 by first fastening members 141, for example, rivets, and a plurality of second through holes 112 disposed near an opposing top portion of the base panel 11 by which the bracket 1 is fixedly fastened to a top cover 2 by second fastening members 142, for example, rivets. The width (diameter) of the first positioning rod portions 131 of the hanging rods 13 is larger than the width (diameter of the second positioning rod portions 132 but slightly smaller than the width of rectangular mounting holes 61 of a server rack 6 (see FIGS. 4 and 6-8). The width (diameter) of the second positioning rod portions 132 is slightly smaller than the diameter of circular mounting holes 71 of the server rack 7.

The top cover 2 includes a cover base panel 21 (see FIGS. 1-3), top and bottom panels 22, 23 respectively and perpendicularly extended from opposing top and bottom sides of the cover base panel 21, top and bottom end flanges 24, 25 respectively and outwardly extended from respective distal ends of the top and bottom panels 22, 23 remote from the cover base panel 21 and connected to said bracket 1. Examples of such connections are shown, for instance wherein a plurality of locating holes 241, 251 are located on the respective top and bottom end flanges 24, 25 and the top cover 2 is affixed to the bracket 1 by respective second fastening members 142. Two longitudinal sliding slots 221, 231 are located on the respective top and bottom panels 22, 23, and two first engagement portions 2211, 2311 are located at respective front ends of the longitudinal sliding slots 221, 231, two second engagement portions 2212, 2312 are located between the respective first engagement portions 2211, 2311 and the longitudinal sliding slots 221, 231, and an elastic member retainer 211 is located at the cover base panel 21.

The elastic member 3, for example shown as spring member 3, has one end 31 thereof connected to the elastic member retainer 211 of the cover base panel 21 and an opposite end 32 thereof connected to a swing seat 4.

Figure 7:
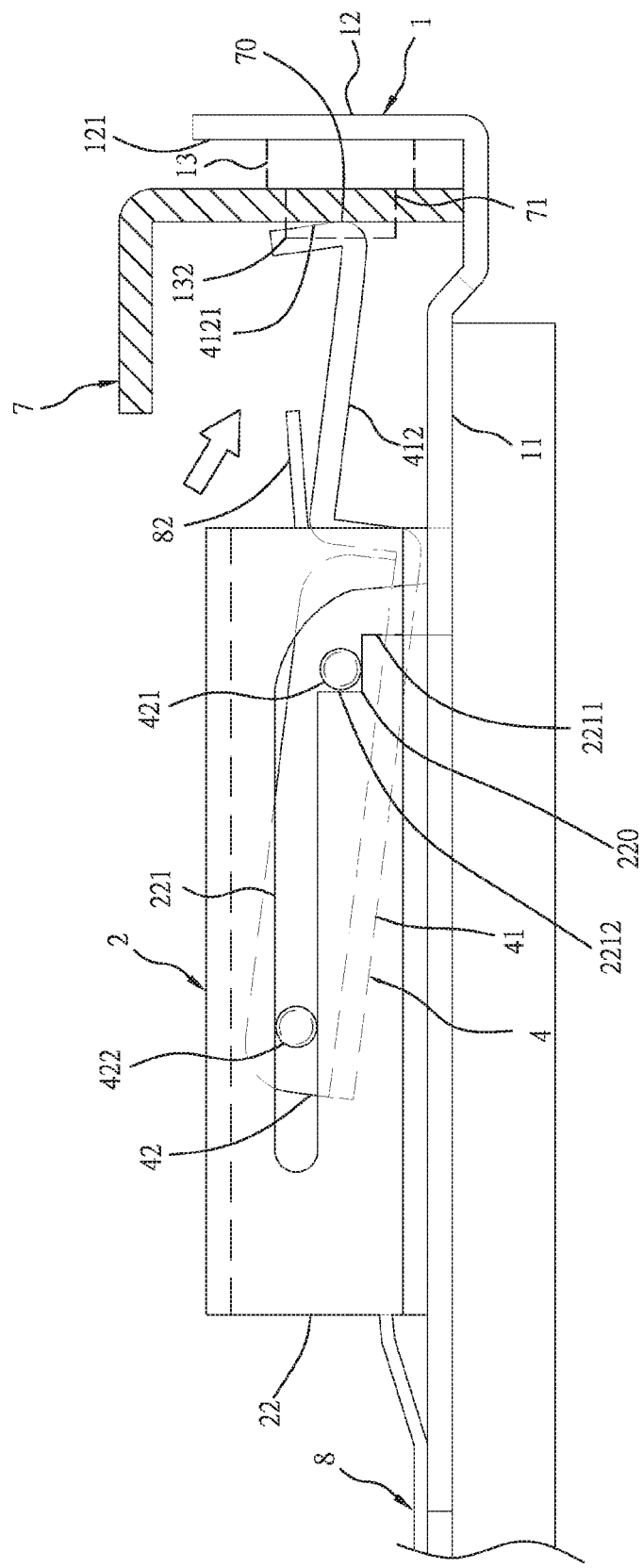
FIG. 7 is a schematic sectional top view that corresponds to FIG. 6, illustrating the first guide rods of the swing seat engaged with respective second engagement portions of the top cover.
Figure 11:
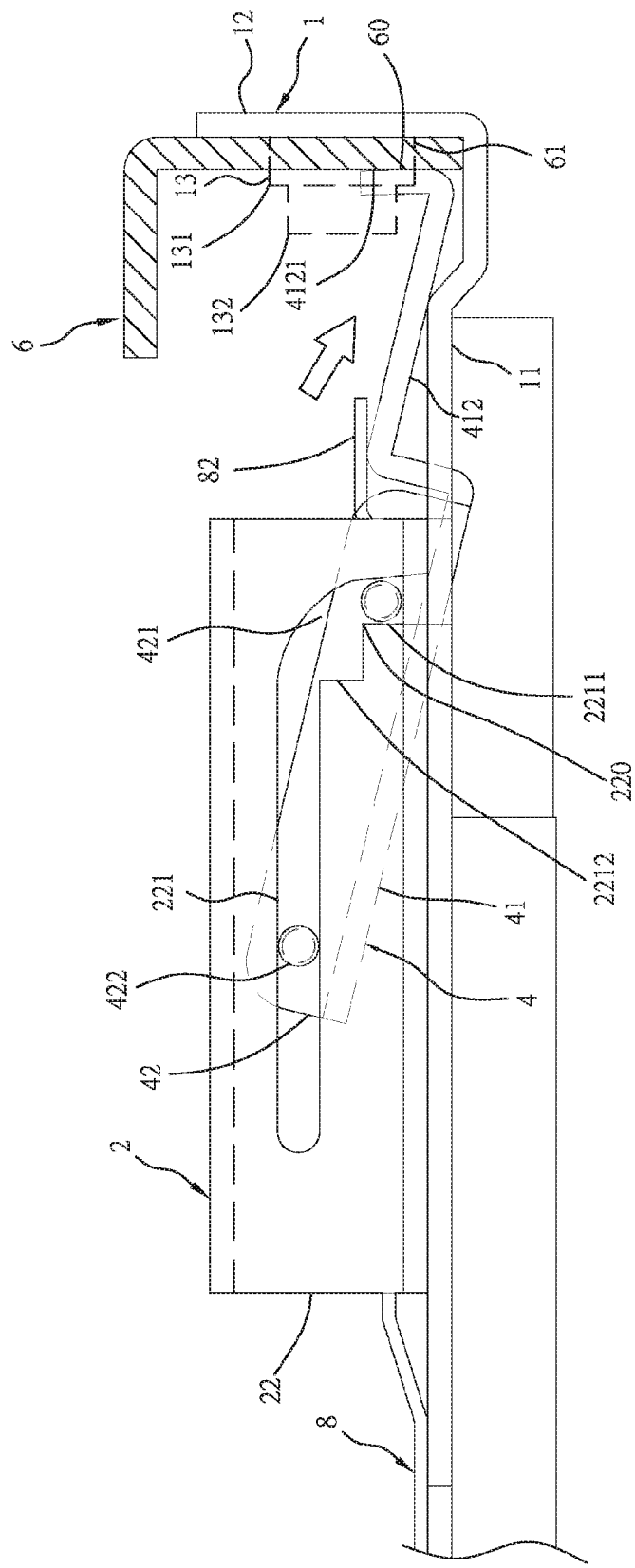
FIG. 11 is a schematic sectional top view of the present invention, illustrating the first guide rods of the swing seat engaged with the respective first engagement portions of the top cover.
Figure 12:
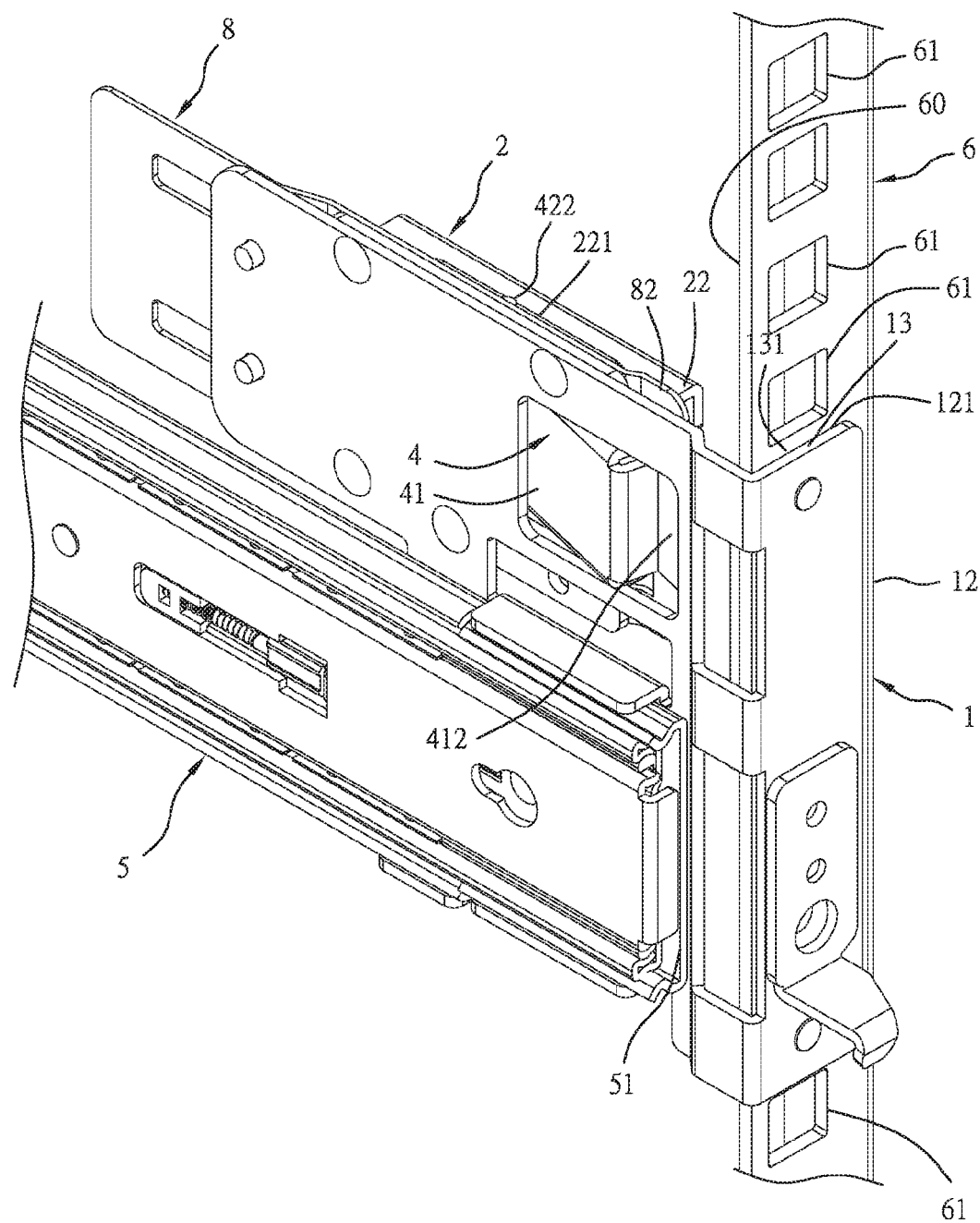
FIG. 12 is a perspective elevational view of the present invention, illustrating the server sliding rail mounting bracket assembly installed in rectangular mounting holes of a server rack.
Figure 13:
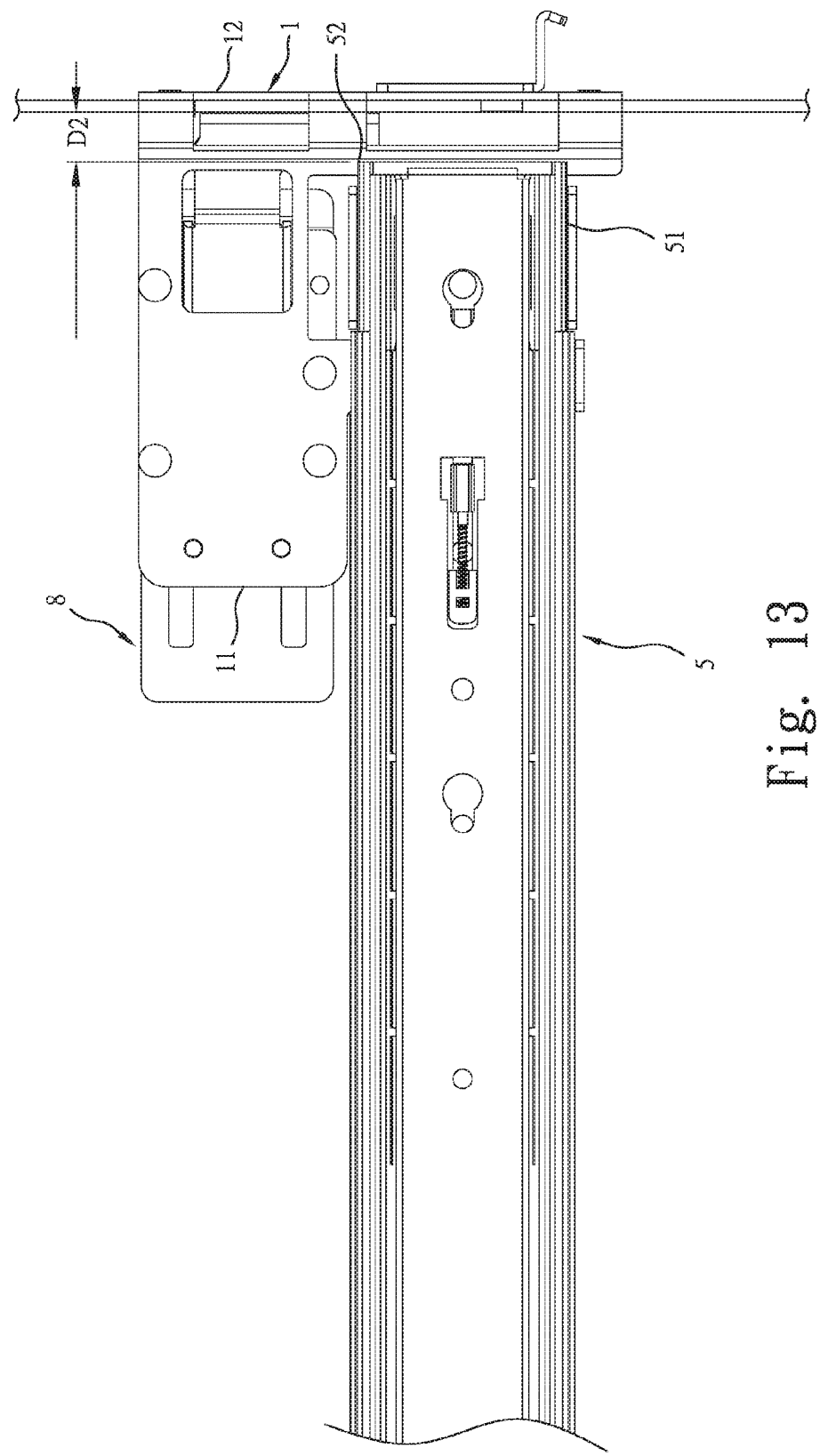
FIG. 13 is a side plan view of FIG. 12.
Figure 14:
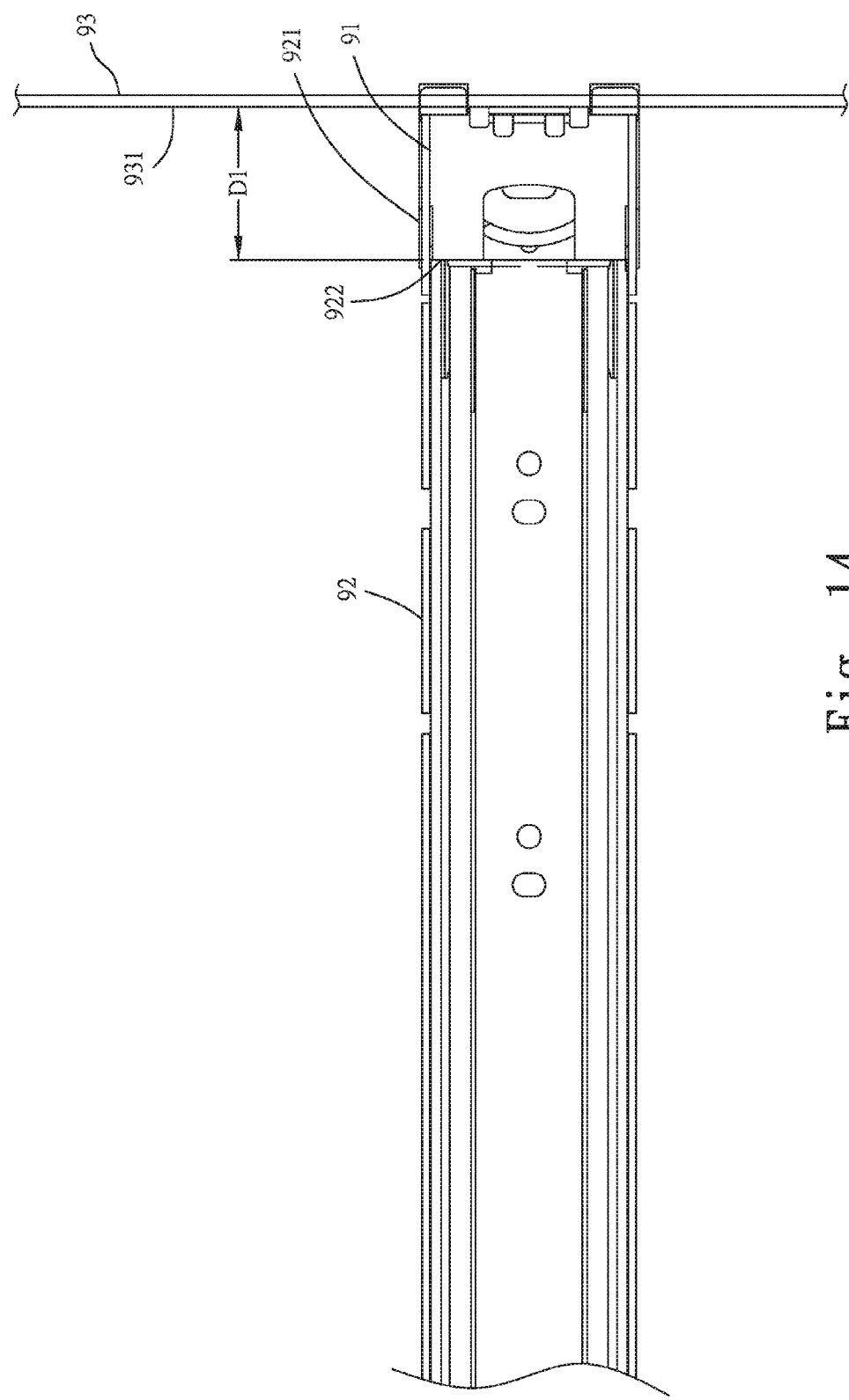
FIG. 14 is a schematic side plan view illustrating a server sliding rail assembly bracket connected to a front end of an outer sliding rail of a server sliding rail assembly and installed in a server rack according to the prior art.

The swing seat 4 (see FIGS. 1-4) includes a seat base 41, top and bottom seat plates 42, 43 are located at respective opposing top and bottom sides of the seat base 41, first guide rods 421, 431 and second guide rods 422, 432 are located at the respective top and bottom seat plates 42, 43 near two opposite ends and respectively slidably inserted into the longitudinal sliding slots 221, 231 in the top and bottom panels 22, 23 of the top cover 2 to guide movement of the swing seat 4 along the longitudinal sliding slots 221, 231 and allowing the first guide rods 421, 431 to be detachably and selectively forced into engagement with the first engagement portions 2211, 2311 or the second engagement portions 2212, 2312, an elastic member retainer 411 extended from a rear side of the seat base 41 for securing the opposite end 32 of the elastic member 3, and a lever 412 extended from an opposing front side of the seat base 41 and terminating in a stop block 4121 for abutment against an inner wall surface 60, 70 of a server rack 6, 7 (see FIG. 7 and FIG. 11).

Thus, when connecting the server sliding rail mounting bracket assembly 10 with the server sliding rail assembly 5 to the rectangular mounting holes 61 of the server rack 6, the lever 412 is pushed and the seat base 41 of the swing seat 4 (see FIG. 5) moves the first guide rods 421, 431 of the swing seat 4 away from the first engagement portions 2211, 2311 of the top cover 2 and then backwardly along the longitudinal sliding slots 221, 231 (see FIG. 10) and simultaneously stretches the elastic member 3, and then forces the first positioning rod portions 131 of the hanging rods 13 of the bracket 1 into the respective rectangular mounting holes 61 of the server rack 6, and then the pressure on the lever 412 of the seat base 41 may be released to enable the swing seat 4 to be pulled by the elastic restoring energy of the elastic member 3 to move the second guide rods 422, 432 forwardly along the longitudinal sliding slots 221, 231 to the extent where the stop block 4121 of the lever 412 is stopped against the inner wall surface 60 of the server rack 6 (see FIG. 11) and the first guide rods 421, 431 are engaged with the respective first engagement portions 2211, 2311 (see FIG. 11). When wishing to dismount the server sliding rail mounting bracket assembly 10 and the server sliding rail assembly 5 from the server rack 6, the lever 412 of the swing seat 4 is pushed (opposite the direction shown in FIG. 7) to disengage the seat base 41 and first guide rods 421, 431 of the swing seat 4 from the respective first engagement portions 2211, 2311 of the top cover 2 and to move the second guide rods 422, 432 backwardly along the respective longitudinal sliding slots 221, 231 (see FIG. 10), thereby moving the stop block 4121 of the lever 412 of the swing seat 4 away from the inner wall surface 60 of the server rack 6. Thereafter, the first positioning rod portions 131 of the hanging rods 13 of the bracket 1 move out of the respective rectangular mounting holes 61 of the server rack 6 to detach the server sliding rail mounting bracket assembly 10 from the server rack 6.

When alternatively mounting the outer sliding rail 51 of the server sliding rail assembly 5 with the server sliding rail mounting bracket assembly 10 to a server rack 7 with circular mounting holes 71, the lever 412 of the swing seat 4 is pushed inwardly (see FIG. 5) to disengage the first guide rods 421, 431 of the swing seat 4 from the respective first engagement portions 2211, 2311 of the top cover 2 and to move the second guide rods 421, 431 backwardly along the respective longitudinal sliding slots 221, 231 (see FIG. 6) to stretch the elastic member 3, and then the second positioning rod portions 132 of the hanging rods 13 of the bracket 1 are inserted into the respective circular mounting holes 71 of the server rack 7, and the release force from the lever 412 of the swing seat 4 enables the second guide rods 422, 432 of the swing seat 4 to be pulled by the elastic restoring energy of the elastic member 3 forwardly along the respective longitudinal sliding slots 221, 231 to force the stop block 4121 of the lever 412 into abutment against the inner wall surface 70 of the server rack 7 (see FIG. 7) and the first guide rods 421, 431 into engagement with the respective second engagement portions 2212, 2312 (see FIG. 7). When dismounting the outer sliding rail 51 of the server sliding rail assembly 5 and the server sliding rail mounting bracket assembly 10 from the server rack 7, the lever 412 of the swing seat 4 is pushed inwardly to force the first guide rods 421, 431 of the swing seat 4 away from the second engagement portions 2212, 2312 of the top cover 2 and to move the second guide rods 422, 432 of the swing seat 4 backwardly along the respective longitudinal sliding slot 221, 231 (see FIG. 6), separating the stop block 4121 of the seat base 41 from the inner wall surface 70 of the server rack 7 and moving the second positioning rod portions 132 of the hanging rods 13 of the bracket 1 from the respective circular mounting holes 71 of the server rack 7, and thus, the server sliding rail mounting bracket assembly 10 is dismounted from the server rack 7.

Figure 3:
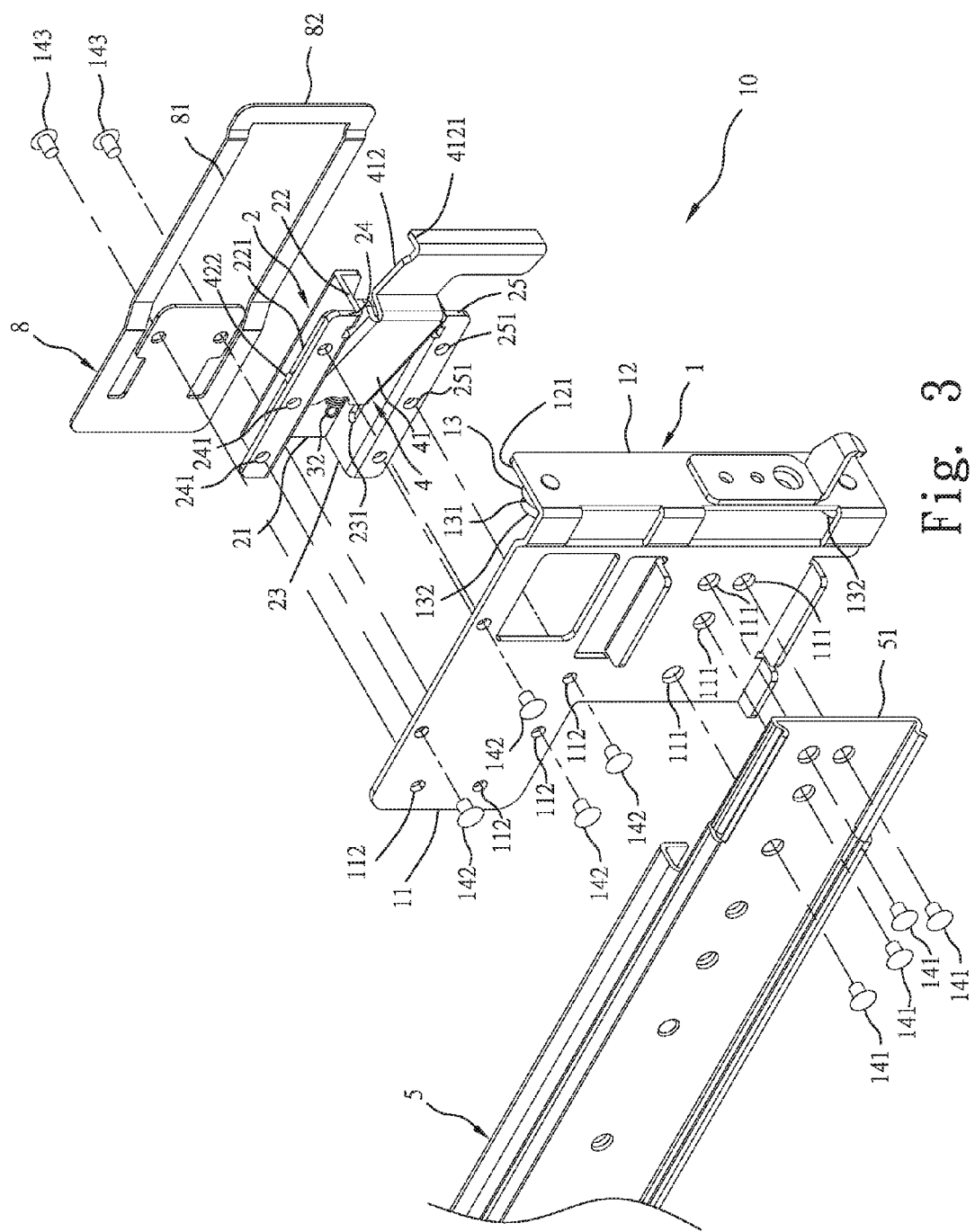
FIG. 3 is an exploded perspective view of the present invention, illustrating the mounting relationship between the bracket of the server sliding rail mounting bracket assembly and the outer sliding rail of the mating server sliding rail assembly.
Figure 4:
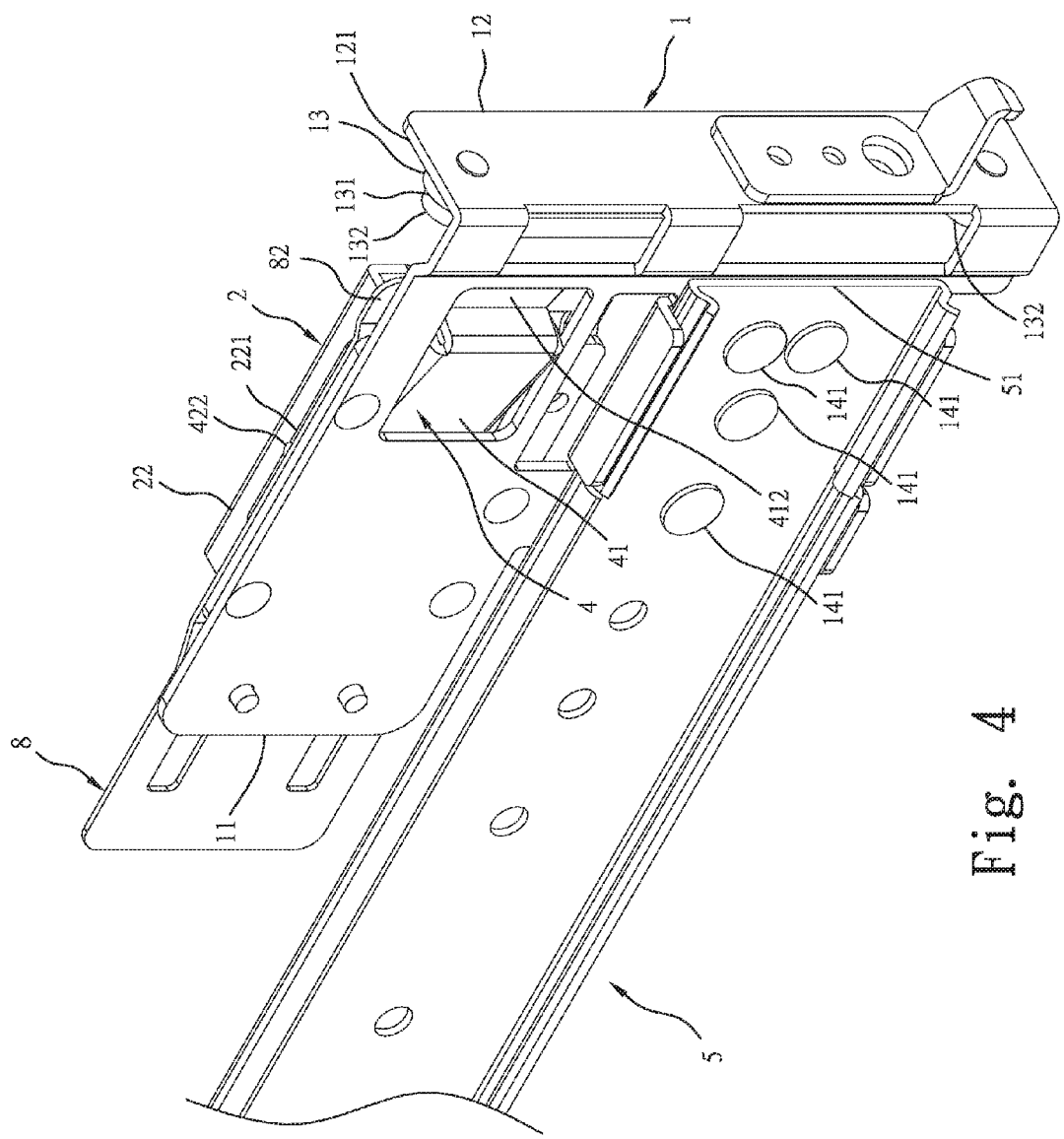
FIG. 4 is a perspective view that corresponds to FIG. 3, illustrating the server sliding rail mounting bracket assembly affixed to the outer sliding rail of the mating server sliding rail assembly.
Figure 5:
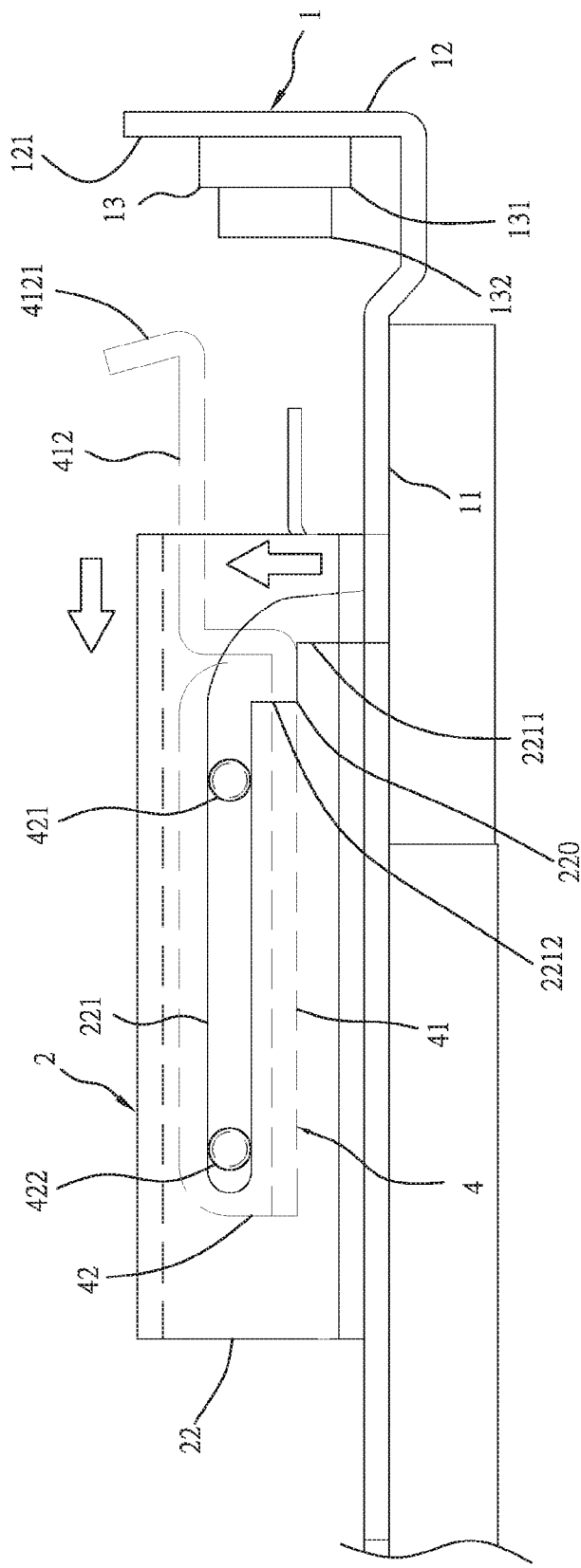
FIG. 5 is a schematic top plan view of the present invention, illustrating the lever of the swing seat pushed and the swing seat moved relative to the top cover.
Figure 6:
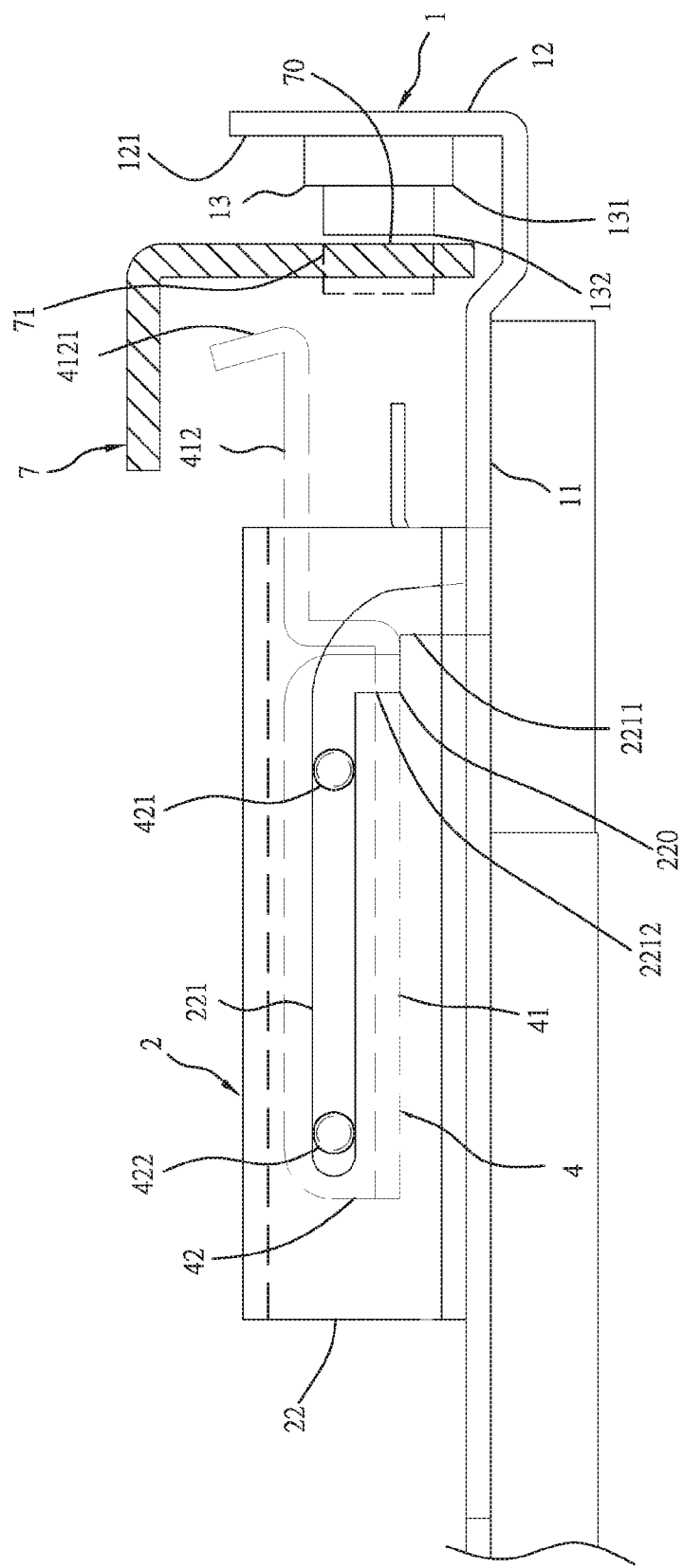
FIG. 6 is a schematic sectional top view of the present invention, illustrating the second positioning rod portions of the hanging rods of the bracket engaged into the respective circular mounting holes of the server rack.
Figure 8:
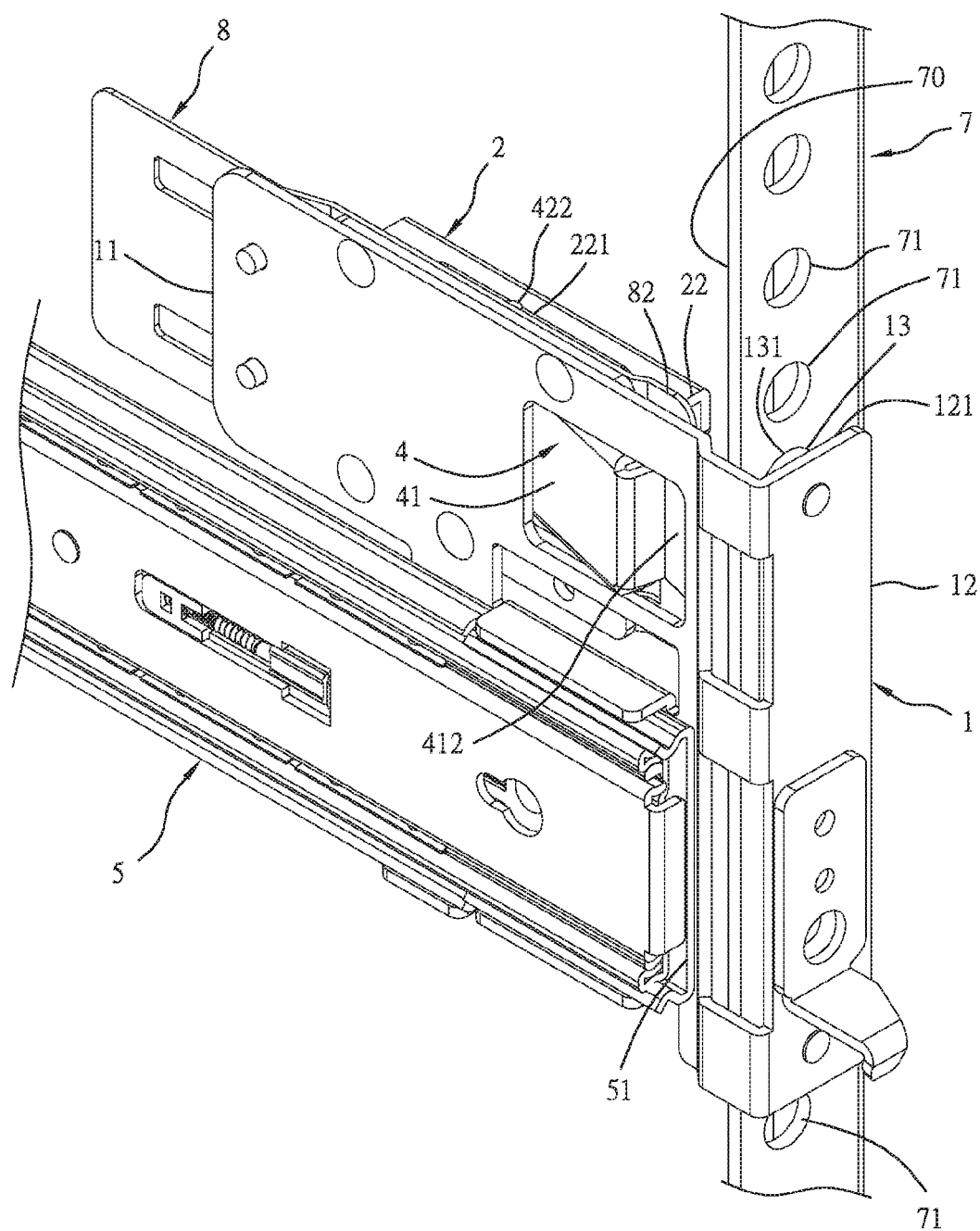
FIG. 8 is a perspective elevational view of the present invention, illustrating the server sliding rail mounting bracket assembly installed in circular mounting holes of a server rack.
Figure 9:
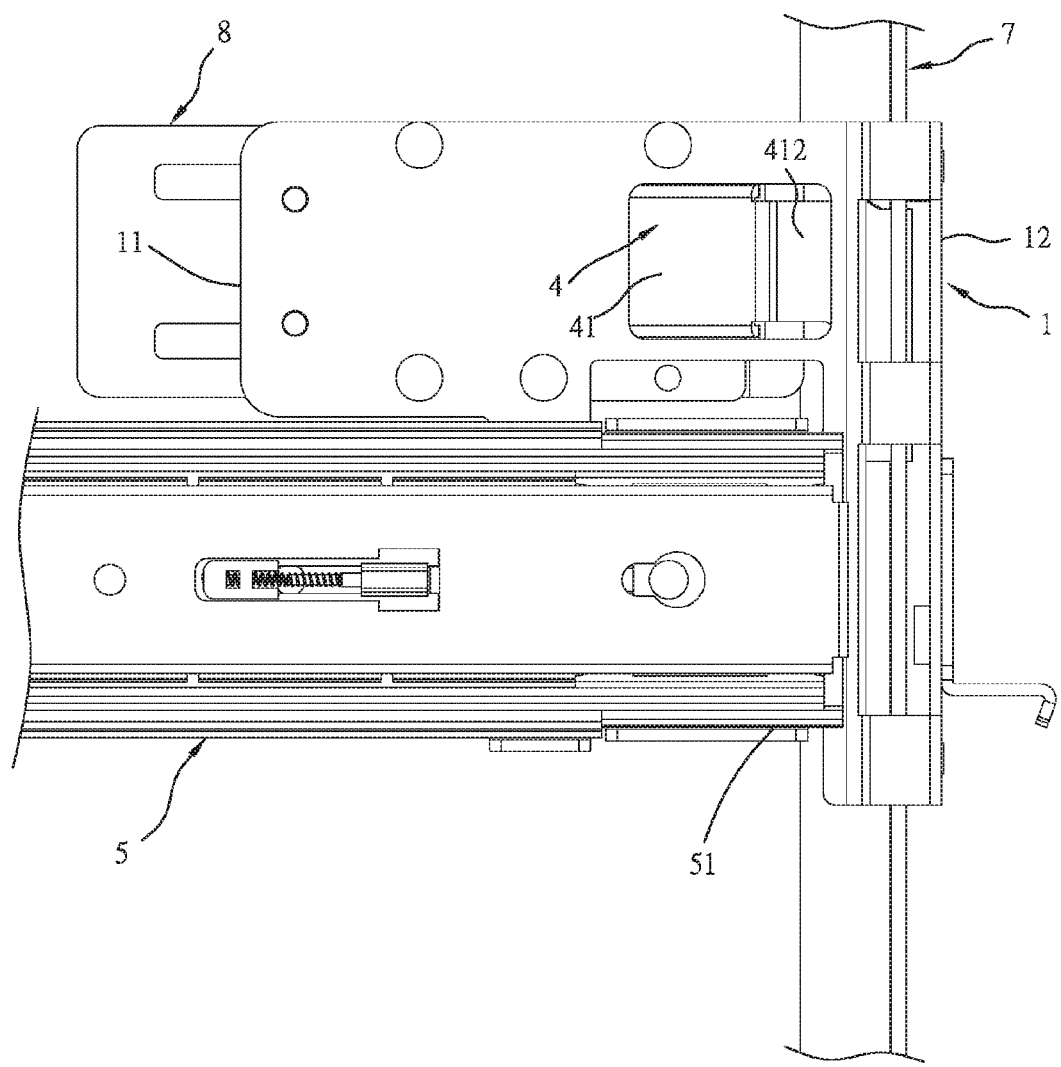
FIG. 9 is a side plan view of FIG. 8.
Figure 10:
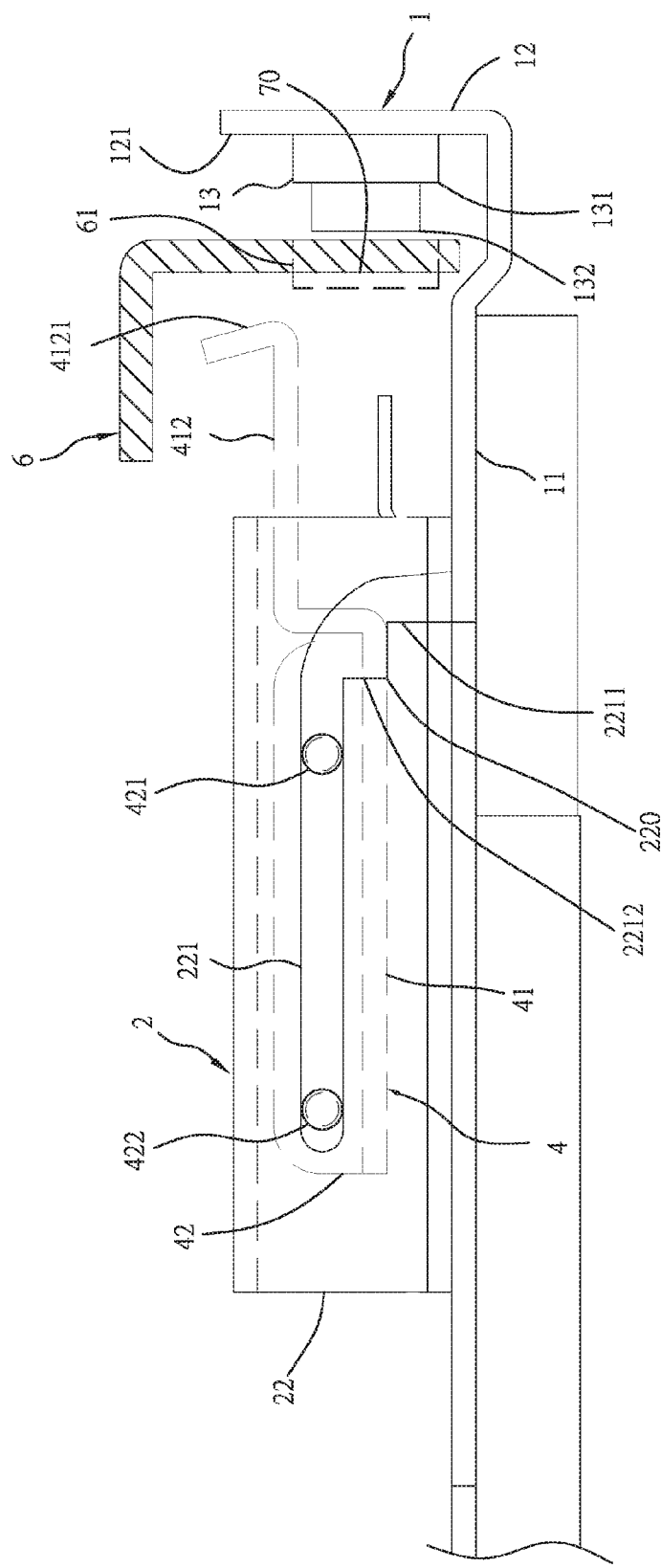
FIG. 10 is a schematic sectional top view of the present invention, illustrating the lever of the swing seat pushed inward and the second positioning rod portions of the hanging rods of the bracket disposed in alignment with the respective circular mounting holes of the server rack.

Further, as illustrated in FIGS. 3-4, 7-9 and 11-13, a spring plate 8 is fastened to the bracket 1 by third fastening members, for example, rivets 143 (see FIGS. 3, 4 and 8). The spring plate 8 includes therein an opening 81 for the passing of the cover base panel 21 and top and bottom panels 22, 23 of the top cover 2 to prevent interference, and a front end portion 82 disposed adjacent to the lever 412 of the swing seat 4. Thus, when the lever 412 is pushed inward, the lever 412 will compress the front end portion 82 of the spring plate 8. When the external force is released from the lever 412, the elastic restoring energy of the spring plate 8 immediately pushes back the lever 412 of the swing seat 4, forcing the second guide rods 422, 432 of the swing seat 4 to move forward along the respective longitudinal sliding slots 221, 231 of the top cover 2 rapidly and accurately.

Further, steps 220, 230 are located at the respective front ends of the longitudinal sliding slots 221, 231 of the top cover 2 (see FIGS. 1 and 2), forming the first engagement portions 2211, 2311 and the second engagement portion 2212, 2312.

In conclusion, the invention provides a server sliding rail mounting bracket assembly, which has advantages and features as follows.

After installation of the server sliding rail mounting bracket assembly 10 with the server sliding rail assembly 5 in the server rack 6 or 7, the gap D2 between the front end of the intermediate sliding rail 52 of the server sliding rail assembly 5 and the inner wall surface 60 or 70 of the server rack 6 or 7 is minimized so that the intermediate sliding rail 52 is kept close to the inner wall surface 60 or 70 of the server rack 6 or 8, and thus, the load capacity of the server sliding rail assembly 5 is significantly enhanced.

Pushing the lever 412 of the swing seat 4 inward can force the hanging rods 13 of the bracket 1 into the respective rectangular mounting holes 61 or respective circular mounting holes 71 of the server rack 6 or 7 directly and accurately. When the applied force disappears, the elastic restoring energy of the elastic member 3 immediately forces the swing seat 4 to move the respective second guide rods 422, 432 forwardly along the respective longitudinal sliding slots 221, 231 to the extent where the stop block 4121 of the lever 412 is stopped against the inner wall surface 60 or 70 of the server rack 6 or 7 and the first guide rods 421, 431 are respectively engaged with the respective first engagement portions 2211, 2311 or second engagement portions 2212, 2312, finishing the installation. When dismounting the server sliding rail mounting bracket assembly 10 and the server sliding rail assembly 5 from the server rack 6 or 7, the lever 412 of the swing seat 4 is pushed inward, allowing the server sliding rail mounting bracket assembly 10 and the server sliding rail assembly 5 to be separated from the server rack 6, 7. Thus, the invention facilitates mounting and dismounting without tools, and is applicable to server racks 6, 7 with rectangular mounting holes 61 or circular mounting holes 71, respectively.

Although a particular example embodiment of the present invention has been described in detail for purposes of illustration, various modifications and enhancements may be made without departing from the spirit and scope of the invention. Accordingly, the invention is not to be limited except as by the appended claims.

What is claimed is:

1. A server sliding rail mounting bracket assembly for connection to a server rack, comprising:
   a bracket, a top cover, an elastic member and a swing seat;
   said bracket comprising a base panel, an end panel extended from a front end of said base panel, a plurality of hanging rods located on an inner surface of said end panel and vertically spaced in line, said bracket being fixedly connected to a front end of an outer sliding rail of a server sliding rail assembly and to the top cover, each said hanging rod comprising a first positioning rod portion connected to said end panel and a second positioning rod portion axially extended from said first positioning rod portion, the width of said first positioning rod portions of said hanging rods being larger than the width of said second positioning rod portions but smaller than the width of rectangular mounting holes of the server rack, the width of said second positioning rod portions being smaller than the diameter of circular mounting holes of the said server rack;

said top cover comprising a cover base panel, top and bottom panels respectively and perpendicularly extended from opposing top and bottom sides of said cover base panel, top and bottom end flanges respectively and outwardly extended from respective distal ends of said top and bottom panels remote from said cover base panel and being connected to said bracket, two longitudinal sliding slots are located on said respective top and bottom panels, two first engagement portions are located at respective front ends of said longitudinal sliding slots, two second engagement portions are located between said respective first engagement portions and said longitudinal sliding slots, and an elastic member retainer is located at said cover base panel;

said elastic member having one end thereof connected to said elastic member retainer of said cover base panel and an opposite end thereof connected to said swing seat; and said swing seat comprising a seat base, top and bottom seat plates are located at respective opposing top and bottom sides of said seat base, first guide rods and second guide rods are located at said respective top and bottom seat plates near two opposite ends and respectively slidably inserted into said longitudinal sliding slots in said top and bottom panels of said top cover to guide movement of said swing seat along said longitudinal sliding slots and allowing said first guide rods to be detachably and selectively forced into engagement with said first engagement portions or second engagement portions, an elastic member retainer extended from a rear side of said seat base for securing said opposite end of said elastic member and a lever extended from an opposing front side of said seat base and terminating in a stop block for abutment against an inner wall surface of the server rack.

2. The server sliding rail mounting bracket assembly as claimed in claim 1, wherein said bracket further comprises a plurality of first through holes located in said base panel near a bottom portion thereof by which said bracket is fixedly connected to the front end of the outer sliding rail of the server sliding rail assembly by first fastening members.

3. The server sliding rail mounting bracket assembly as claimed in claim 1, wherein said bracket further comprises a plurality of second through holes located in said base panel near a top portion thereof and said top cover further comprises a plurality of locating through holes in said top and bottom end flanges by which said bracket is fixedly connected to the top cover by second fastening members.

4. The server sliding rail mounting bracket assembly as claimed in claim 1, further comprising a spring plate connected to said bracket, said spring plate comprising an opening for the passing of said cover base panel and said top and bottom panels of said top cover and a front end portion disposed adjacent to and pressable by said lever of said swing seat.

5. The server sliding rail mounting bracket assembly as claimed in claim 4, wherein said spring plate is fixedly fastened to said bracket by third fastening members.

6. The server sliding rail mounting bracket assembly as claimed in claim 1, wherein said top cover comprises steps respectively located at respective front ends of said longitudinal sliding slots and forming the respective said first engagement portions and said second engagement portions.

* * * * *